United States Patent
Phan et al.

(10) Patent No.: US 6,753,261 B1
(45) Date of Patent: Jun. 22, 2004

(54) IN-SITU CHEMICAL COMPOSITION MONITOR ON WAFER DURING PLASMA ETCHING FOR DEFECT CONTROL

(75) Inventors: Khoi A. Phan, San Jose, CA (US); Arvind Halliyal, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 188 days.

(21) Appl. No.: 10/052,173

(22) Filed: Jan. 17, 2002

(51) Int. Cl.[7] ........................ H01L 21/302; H01L 21/461
(52) U.S. Cl. ........................ 438/706; 438/709; 438/710
(58) Field of Search ........................ 438/706, 709–711, 438/716, 717, 723–725; 324/501, 765

(56) References Cited

U.S. PATENT DOCUMENTS

| | | | |
|---|---|---|---|
| 5,233,191 A | * 8/1993 | Noguchi et al. | ............ 250/306 |
| 6,052,183 A | 4/2000 | Lee | ............ 356/337 |
| 6,238,940 B1 | * 5/2001 | Steffan et al. | ............ 438/14 |
| 6,320,401 B1 | * 11/2001 | Sugimoto et al. | ............ 324/765 |
| 6,566,885 B1 | * 5/2003 | Pinto et al. | ............ 324/501 |

* cited by examiner

Primary Examiner—Nadine Norton
Assistant Examiner—Duy-Vu Deo
(74) Attorney, Agent, or Firm—Amin & Turocy, LLP

(57) ABSTRACT

One aspect of the present invention relates to a system and method for monitoring in-situ a chemical composition at or near a surface of a wafer during plasma etch to detect defects The method involves the steps of providing a semiconductor substrate comprising at least one top layer, wherein the semiconductor substrate comprises at least one chemical-containing contaminant; subjecting the semiconductor substrate to a plasma etch process, whereby at least a portion of the top layer is removed; during the plasma etch process, detecting for a presence of the chemical-containing contaminant using one of an Auger Electron Spectroscopy system or Energy Dispersive X-ray Analysis system; and if present, determining whether the presence of the chemical-containing contaminant exceeds a threshold limit.

20 Claims, 6 Drawing Sheets

IN-SITU CHEMICAL COMPOSITION MONITOR ON WAFER DURING PLASMA ETCHING FOR DEFECT CONTROL

TECHNICAL FIELD

The present invention generally relates to detecting defects on a wafer during semiconductor processing. In particular, the present invention relates to defect detection during plasma etching via an in-situ chemical composition monitor.

BACKGROUND ART

In the semiconductor industry, there is a continuing trend toward higher device densities. To achieve these high densities there has been and continues to be efforts toward scaling down the device dimensions on semiconductor wafers (e.g., at submicron levels). In order to accomplish such high device packing density, smaller and smaller features sizes are required. This may include the width and spacing of interconnecting lines, spacing and diameter of contact holes and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

The ability to reduce the size of computer chips while increasing packing densities and performance is driven by lithography technology, particularly at critical layers such as trench, polysilicon, contact/via and metal layers. Due to the large number of critical masking steps in a modern semiconductor device fabrication process and the inherent ability to impact pattern fidelity, lithographic defects are particularly dangerous. Defect detection and defect control at these critical layers is even more important at deep sub-micron levels since these defects often act as micro-masks during etching, thereby directly affecting pattern fidelity. Micromasking defects at the critical layers are often killers. That is, they are often destructive to wafer structure and performance, resulting in circuit failure and yield loss.

Unfortunately, not all lithographic defects as well as other defects (e.g., flakes present in an etch chamber) can be detected on wafers before an etching process takes place (e.g., plasma etch process). Thus, there is an unmet need to non-invasively detect, control and mitigate the presence of defects which may be present before, during and/or after a plasma etch process.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a system and a method for in-situ monitoring and detecting the presence of chemical elements which may be found in contaminants (i.e., defects) on a wafer structure. In particular, the present invention allows for the detection and identification of contaminant defects, including possible sources or causes of defect formation. For example, the presence of carbon, calcium and/or sulfur may indicate the presence of photoresist residue; thus the photoresist removal process may be inadequate, insufficient, or flawed and may require further diagnostic procedures to determine a more precise cause for the flawed process. Likewise, the presence of aluminum or tungsten may indicate the presence of etch chamber flakes on the layer; and the presence of nickel may indicate the presence of residue from an SOI substrate on the layer. Such contaminant defects may form at or near a surface of the wafer but more importantly, at critical layers of a semiconductor structure.

The present invention also provides a chemical tracing monitoring system in which plasma discharge is used to detect chemical elements commonly found in defects and to detect high defect excursions (i.e., high defect densities), both of which may adversely affect product yield and circuit performance.

One aspect of the present invention relates to a method for monitoring in-situ a wafer's chemical composition at or near a surface of the wafer during plasma etch to detect defects. The method includes the steps of providing a semiconductor substrate comprising at least one top layer, wherein the semiconductor substrate comprises at least one chemical-containing contaminant; subjecting the semiconductor substrate to a plasma etch process, whereby at least a portion of the top layer is removed; during the plasma etch process, detecting for a presence of the chemical-containing contaminant using one of an Auger Electron Spectroscopy system or Energy Dispersive X-ray Analysis system; and if present, determining whether the presence of the chemical-containing contaminant exceeds a threshold limit.

Another aspect of the present invention relates to a system for monitoring in-situ a wafer's chemical composition at or near a surface of the wafer during plasma etch to detect defects. The system includes a semiconductor substrate comprising at least one top layer, wherein the semiconductor substrate comprises at least one chemical-containing contaminant; a plasma etch chamber in which the wafer is placed to undergo a plasma etch process; a defect detector operatively coupled to the plasma etch chamber and comprising one or more sensor systems, the one or more sensor systems being at least one of an Auger Electron Spectroscopy system or an Energy Dispersive X-ray Analysis system, wherein the defect detector detects the chemical-containing contaminant; a defect analyzer operatively coupled to the defect detector for determining whether the presence of the chemical-containing contaminant exceeds a threshold limit; and a fabrication process controller operatively coupled to the defect analyzer for determining whether to the fabrication process or to continue the fabrication process.

Yet another aspect of the present invention relates to a method for monitoring in-situ a wafer's chemical composition at or near a surface of the wafer during plasma etch to detect defects. The method involves the steps of providing a semiconductor substrate comprising at least one top layer, wherein the semiconductor substrate comprises at least one chemical-containing contaminant; subjecting the semiconductor substrate to a plasma etch process, whereby at least a portion of the top layer is removed; during the plasma etch process, detecting for a presence of the chemical-containing contaminant using one of an Auger Electron Spectroscopy system or Energy Dispersive X-ray Analysis system; and if present, suspending the semiconductor fabrication process when the at least one chemical-containing contaminant exceeds a threshold limit.

DISCLOSURE OF INVENTION

Figure 1:
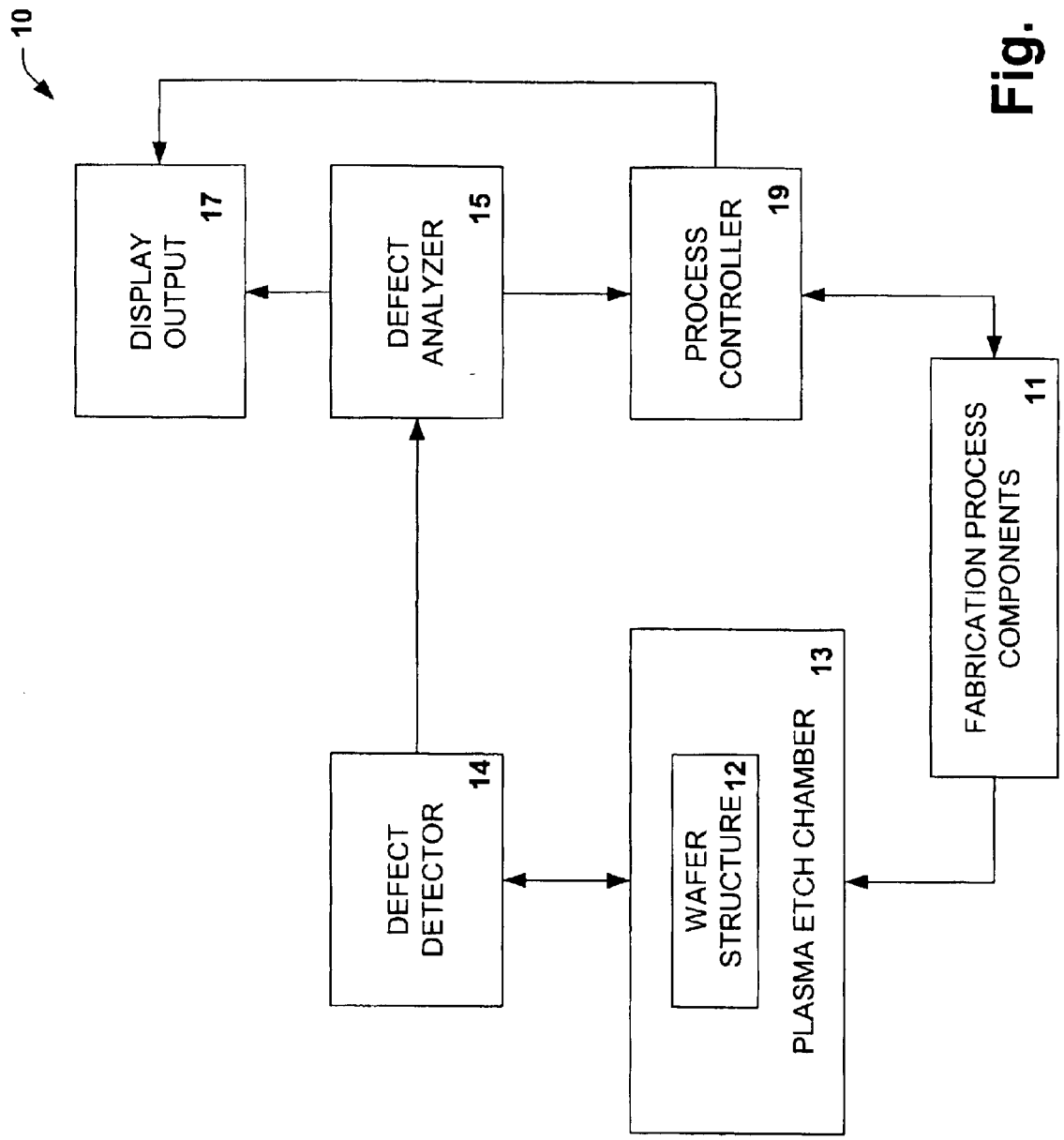
FIG. 1 illustrates a high-level schematic diagram of a system according to one aspect of the present invention.

The present invention involves a system and a method for in-situ monitoring of defect formation at or near a top surface of a wafer structure, including critical layers at or below the surface of the wafer structure. One aspect of the present invention more particularly relates to a system and method for in-situ monitoring defect formation on a partially or substantially fabricated wafer structure. The in-situ monitoring is carried out by detecting for the presence of chemical elements commonly found in wafer defects during a plasma etch process. That is, the detection process occurs during the plasma etch process. Plasma discharge of the chemical elements facilitates detection of their presence on the wafer, particularly at or near the surface of the wafer and more importantly, at critical layers of the structure. As a result of the present invention, detection of chemical containing contaminants/defects on the wafer is facilitated. Since the defects at critical layers of the wafer structure can be detected during semiconductor fabrication (i.e., a plasma etch process), product yield loss and circuit failure can be mitigated.

In the present invention, a partially fabricated semiconductor structure is placed into a plasma etch chamber to undergo a conventional plasma etch process whereby a portion of the top layer of the semiconductor structure is removed. During such plasma etch process, defect detection may occur simultaneously or concurrently with the plasma etch process, thereby indicating whether chemical-containing defects exist at a critical layer of the structure. A positive showing of one or more chemicals, such as carbon, calcium, sulfur, aluminum, tungsten and nickel may indicate that one or more defects may be present on the wafer. If an amount of a detected chemical exceeds a pre-determined threshold limit, then the fabrication process may be terminated or suspended in order to investigate the source or cause of the defect.

With termination, the fabrication process effectively stops, the defective wafer is discarded and a user may be signaled to investigate. The fabrication will resume when it is deemed appropriate to begin fabricating a new wafer or structure.

With suspension, the fabrication process may stop temporarily if the amount of the detected chemical is about equal to or exceeds the threshold limit. This allows for a user to assess the type and extent of a detected defect and to determine whether to continue or terminate the fabrication process.

If the threshold limit is not exceeded, then the fabrication process may continue. The threshold limit may be determined accordingly so that the presence of the chemical/defect is low enough to not substantially affect overall circuit performance. The amount of the chemical detected indicates a degree of defect formation. Therefore, a higher amount of the chemical may mean a higher degree of defects exist on the wafer in general and more importantly, at the particular critical layer.

According to one aspect of the present invention, Auger Electron Spectroscopy (AES) and/or Energy Dispersive X-ray Analysis (EDXA) may be employed either separately or in conjunction with one another to detect, identify and quantify chemical-containing defects. In general, both systems may identify elemental compositions at or near surfaces (i.e., including insulating materials) by detecting and measuring either electrons or x-rays.

In particular, AES identifies compositions of surfaces by measuring the energies of Auger electrons. According to the principles of AES, electrons of energy in a range from 3–20 keV are incident upon a sample. These electrons cause core electrons from atoms contained in the sample to be ejected resulting in a photoelectron and an atom with a core hole. The atom then relaxes via electrons with a lower binding energy dropping into the core hole. The energy thus released can be either converted into an x-ray or emitted as an electron. This electron is termed an Auger electron. After the emission of the Auger electron, the atom is left in a doubly ionized state. The energy of the Auger electron is characteristic of the element that emitted it and can thus be used to identify the element. An Auger spectrum (FIG. 6) plots a function of electron signal intensity versus electron energy. In addition, AES is highly effective at the surface or between 1–5 nm into the surface.

Figure 5:
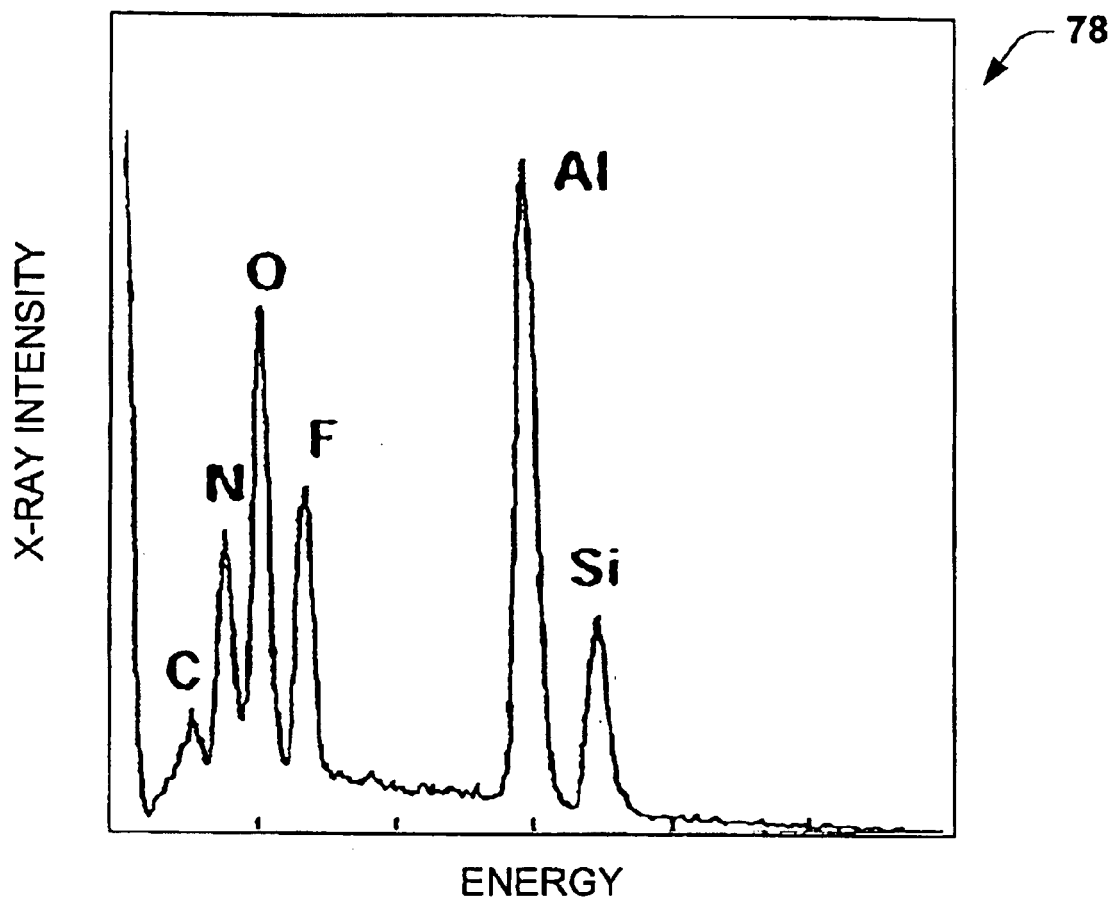
FIG. 5 illustrates an exemplary graph of chemical contaminant spectrum according to one aspect of the present invention.

EDXA, however, is more highly effective at a sampling depth of about 1–2 $\mu$m for samples as small as 1 $\mu$m in diameter. Therefore, it is more widely used to examine insulating layers as well as other buried layers of a semiconductor structure. EDXA may be used in conjunction with a Scanning Electron Microscopy (SEM) as well as a Electron Microprobe, X-Ray Diffraction (XRD) or X-Ray Fluorescence (XRF) instrument. EDXA involves striking the surface of a sample with an electron beam typically in an energy range of 10–20 keV in a vacuum system of a SEM, XRD and the like as listed above. This action causes x-ray photons to be emitted from the material sample. The energy of the x-rays emitted depend on the material under examination. Since each element has its own unique set of energy levels, the emitted photons are indicative of the element that produced them. Analyzers may then be used to characterize the x-ray photons for their energy (or wavelength) and abundance to determine the chemistry of the sample in the form of an x-ray spectrum (FIG. 5).

Following analysis by AES and/or EDXA, the chemical composition at or near the surface of the wafer may be determined in order to further identify defects and to even pinpoint their sources. More specifically, formulated spectra from either AES or EDXA or both may be compared to known spectra, respectively, to determine the identity and the amount of the detected chemical. For example, emission spectra corresponding to known chemical containing defects may be stored in a memory for comparison to a generated emission spectrum. The stored spectra may also include the spectra of individual known chemical elements. Comparison of the known spectra to the generated spectrum may facilitate determining the chemical composition of a detected defect and/or its cause.

It should be understood that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

Moreover, the present invention facilitates a reduction in defect formation in partially fabricated semiconductor structures as well as a reduction in fully fabricated wafers having one or more defects at a critical layer. As a result, semiconductor performance and product yield are improved.

The present invention is now described with reference to FIGS. 1–6, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate description of the present invention.

Figure 2:
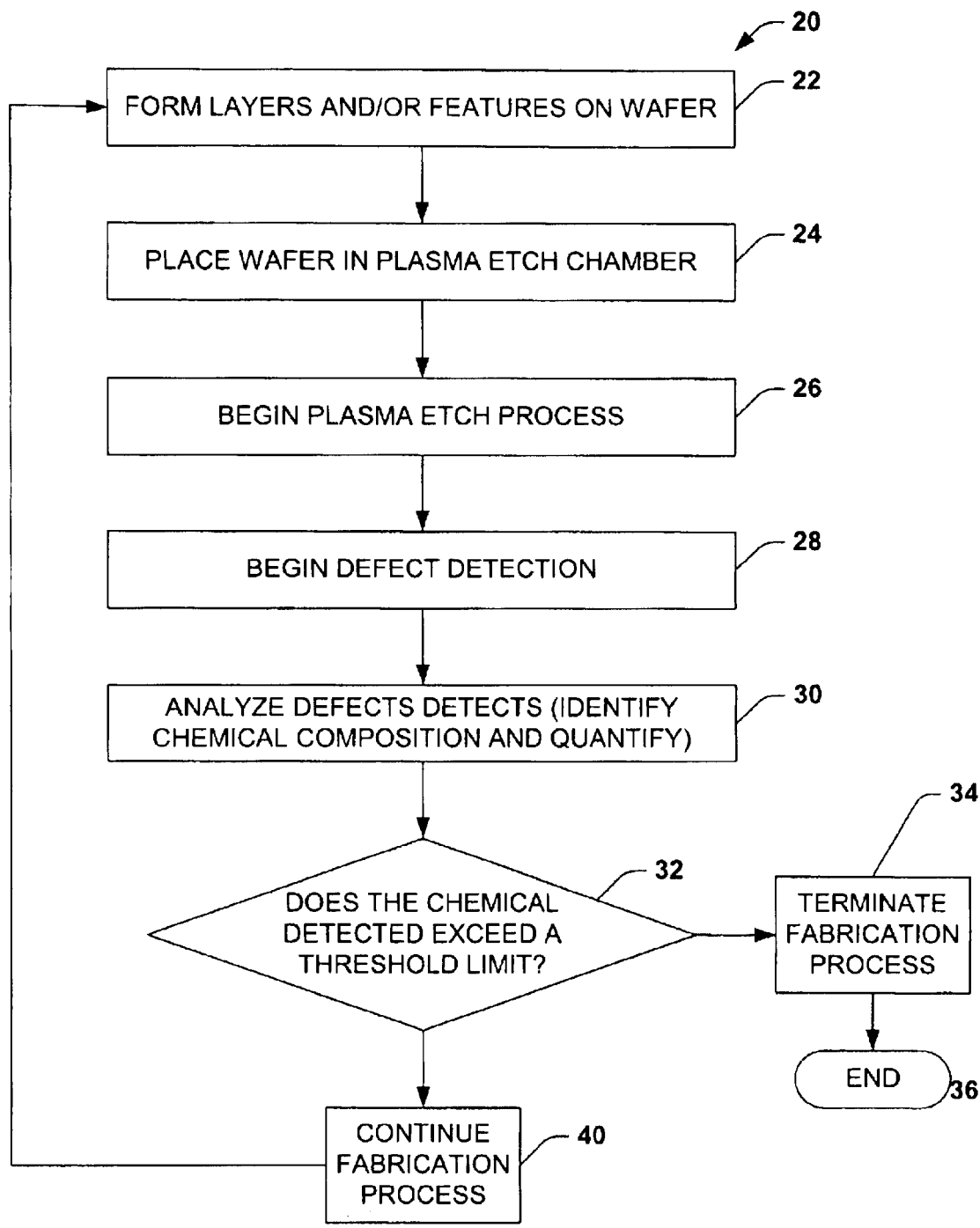
FIG. 2 illustrates a high-level process flow diagram of a method according to another aspect of the present invention.

Referring initially to FIGS. 1 and 2, a high-level schematic diagram of a system 10 and a process flow diagram 20, respectively, for in-situ monitoring of a wafer's chemical composition to detect and control defect formation are shown. The system 10 includes semiconductor fabrication process components 11 which partially fabricate at least one layer and/or at least one feature (e.g., via, conducting line, gate, etc.) on a wafer structure 12 (FIG. 2, at 22). Fabrication process components 11 include, but are not limited to, photoresist and layer deposition and patterning, etch parameters such as exposure time, temperature, pressure and the like, and development parameters.

The partially fabricated wafer structure 12 is then placed within a plasma etch chamber 13 (FIG. 2, at 24). The wafer structure 12 is undergoing a plasma etch process within the chamber 13 (FIG. 2, at 26). During the plasma etch process, a defect detector 14 may be used to detect for the presence of contaminants or defects on the wafer structure 12 (FIG. 2, at 28). Such defect detection may be performed using either AES or EDXA or both in order to detect chemical containing defects at or near the surface of critical layers or at insulating layers, respectively, within the wafer structure 12.

Figure 6:
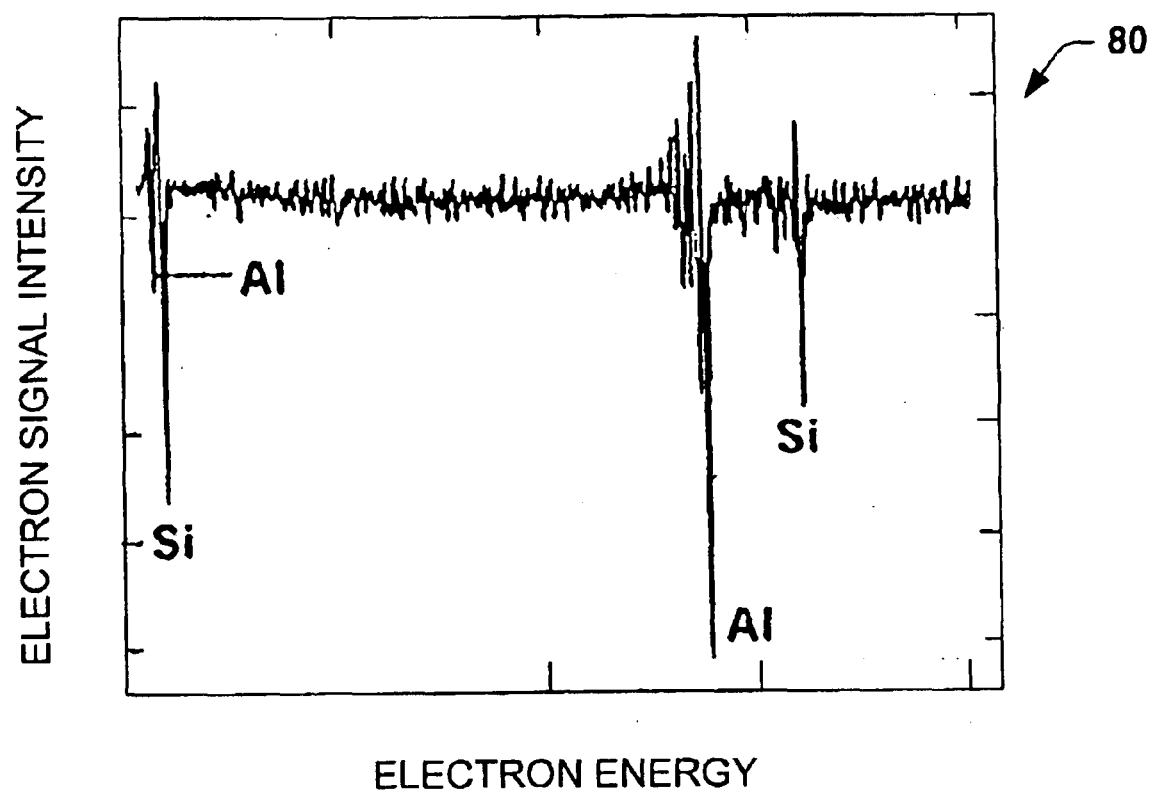
FIG. 6 illustrates an exemplary graph of chemical contaminant particle analysis according to one aspect of the present invention.

Upon detecting chemical contaminants, a defect analyzer 15 may be employed to identify and/or quantify the chemical components of the contaminants (FIG. 2, at 30). Identification may be also be performed by comparing a generated spectrum with known spectra of chemical elements. The generated spectrum represents the emission signature of the elements contained in the detected contaminants. Results of the defect analysis may be transferred to an output display 17 in a form such as a particle analysis (FIGS. 5 and 6). The particle analysis can provide the identity the chemical elements as found at or near the measured layer or surface as well as the measured quantity of the chemical contaminants detected.

The results of the defect analysis may also be transmitted to a fabrication process controller 19. The process controller 19 determines whether the generated spectrum, in terms of identity and quantity of the chemical, exceeds a predetermined threshold limit (FIG. 2, at 32). If the threshold limit is exceeded, then the fabrication process controller may signal the fabrication process to terminate immediately (FIG. 2, at 34); and the process effectively ends (FIG. 2, at 36). In particular, when the threshold limit is exceeded by as few as one chemical, then the fabrication process may be terminated to mitigate circuit failure and product yield loss. Furthermore, the source of the one or more chemical contaminants may also be determined by analyzing the identity and quantity of the one or more detected chemicals. Conversely, if the threshold limit for a particular chemical is not exceeded, then the fabrication process continues under prescribed and pre-scheduled conditions and parameters (FIG. 2, at 38).

The system 10 also may include an emission spectra database (not shown) operatively coupled to the defect analyzer 15 and/or process controller 19. The emission spectra database may be made up of hundreds of thousands of known emission spectra. The known emission spectra correspond to chemical-containing contaminants detected on a variety and type of layers and features formed and in a variety of defect densities found on a semiconductor structure. The defect analyzer 15 may "search through" the stored spectra to find a closest match to a generated emission spectra. This comparison facilitates determining chemical composition, density and location of the contaminants on the layer as well as possible causes for the defects.

Interpolation between the two closest matching spectra further may be employed to discern a more accurate analysis of composition and density from the known spectra in the database. Alternatively, artificial intelligence techniques may be employed to calculate desired parameters of the wafer under test based on the detected optical properties.

The process controller 19 may also include a processor (not shown), such as a microprocessor or CPU, coupled to a memory (not shown). The processor may receive data from the defect analyzer 15. The processor also is operatively coupled to the fabrication process components 11. Using the processor at least in part, the process controller 19 may be programmed/and or configured to control and operate the various components within the monitoring system 10 in order to carry out the various functions described herein.

The processor may be any of a plurality of processors, such as the AMD K6®, ATHLON™ or other similar processors. The manner in which the processor 110 can be programmed to carry out the functions relating to the present invention will be readily apparent to those having ordinary skill in the art based on the description provided herein.

The memory serves to store program code executed by the processor for carrying out operating functions of the system 10 as described herein. The memory may include read only memory (ROM) and random access memory (RAM). The ROM contains among other code the Basic Input-Output System (BIOS) which controls the basic hardware operations of the system 10. The RAM is the main memory into which the operating system and application programs are loaded. The memory also serves as a storage medium for temporarily storing information such as temperature, temperature tables, position coordinate tables, interferometry information, electron emission tables for the chemical elements, and algorithms that may be employed in carrying out the present invention. The memory also can hold patterns against which observed data can be compared as well as information concerning grating sizes, grating shapes, x-ray photon and/or electron emissions information, achieved profiles, desired profiles and other data that may be employed in carrying out the present invention. For mass data storage, the memory may include a hard disk drive.

The system 10 may also be powered by a power display (not shown). Any suitable power supply (e.g., battery, line power) may be employed to carry out the present invention.

The system further includes the output display 17 operatively coupled to the defect analyzer 15 and/or process controller 19 (not shown) for displaying a representation (e.g., graphical and/or text) of one or more process conditions, such as defect formation, temperature, gas flow rates, etc. The display 17 further may show a graphical and/or textual representation of the measured photon or electron emission properties at various locations along the surface of the wafer structure 12.

Figure 3:
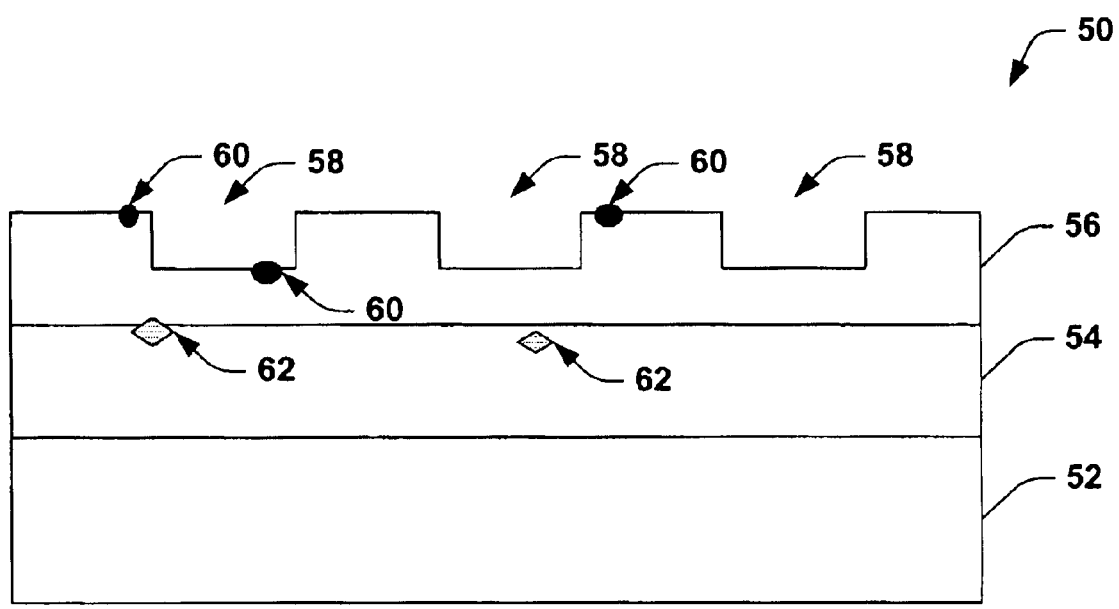
FIG. 3 illustrates a cross-sectional view of a partially fabricated semiconductor structure about to undergo a plasma etch process according to one aspect of the present invention.

FIG. 3 illustrates an exemplary partially fabricated semiconductor structure 50 according to the present invention. The structure 50 is shown having a semiconductor substrate 52, an insulating layer 54 and a top critical layer 56 having features 58 formed therein. As can be seen, contaminant defects 60 and 62 are present in or on the top critical layer 56 and the insulating layer 54, respectively.

Figure 4:
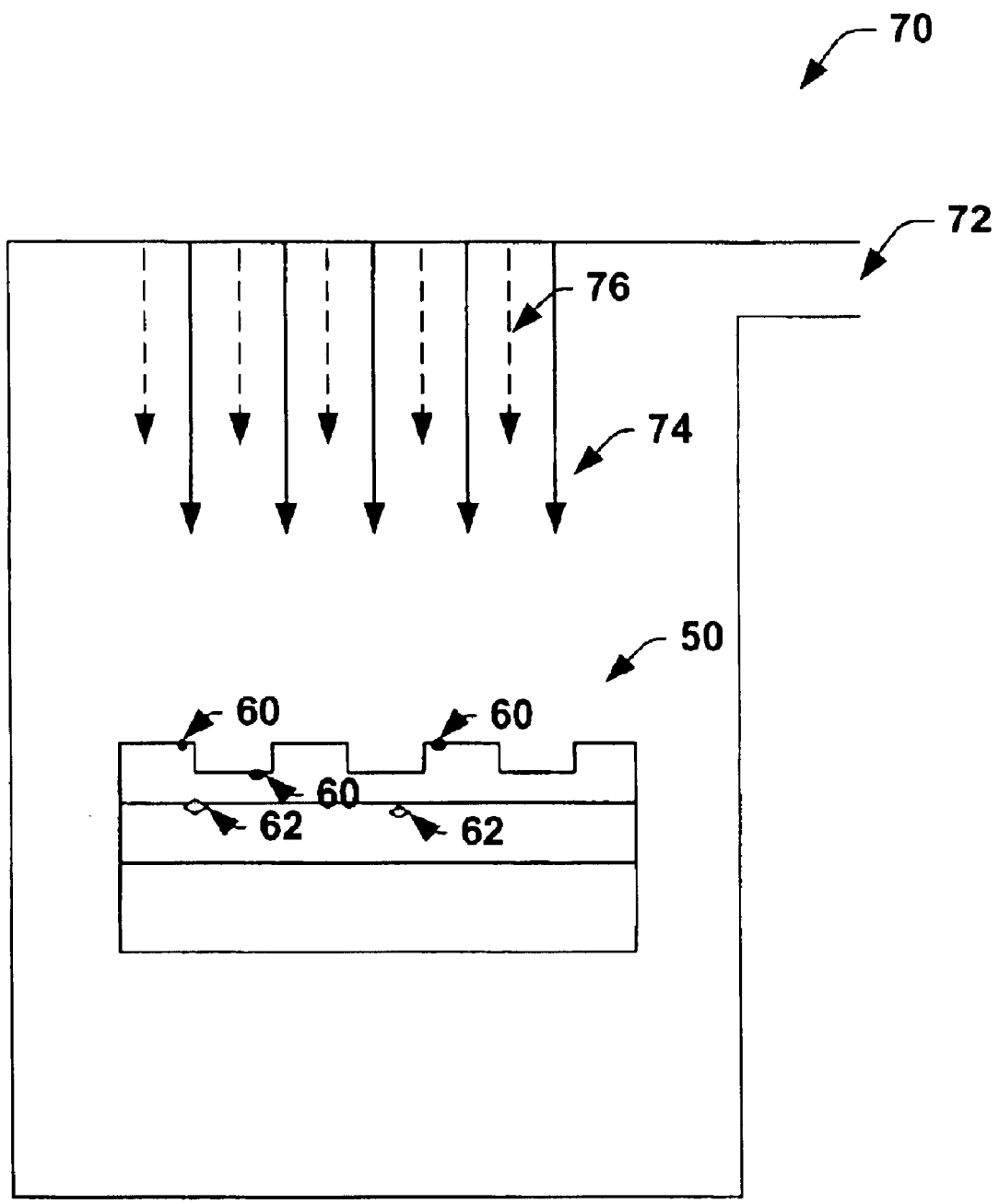
FIG. 4 illustrates a frontal view of a processing chamber housing a partially fabricated semiconductor structure having chemical contaminants thereon in accordance with one aspect of the present invention.

Turning now to FIG. 4, the partially fabricated semiconductor structure 50 is placed in a plasma etch chamber 70 in order to undergo a conventional plasma etch process 74 (solid lines). However, unlike conventional plasma etch processes, a defect detection process 76 (dotted lines) is to take place either simultaneously or concurrently with the plasma etch process 74. The plasma etch chamber includes a vacuum 72 as well as other known attributes typical of conventional plasma etch chambers not listed here for the sake of brevity.

As previously described, chemicals present in contaminant defects 60, 62 on or in the semiconductor structure 50 may be detected during a plasma etch process using chemical analysis techniques such as AES and/or EDXA. Chemicals contained in the contaminant defects 62 in the insulating layer 54 may be detected using EDXA since this method is highly effective at about 1–2 μm from the top surface of the structure 50.

FIG. 5 shows an exemplary spectrum 78 at 3 keV of chemical residue found on an insulating layer which has been generated by a defect analyzer, in particular, an EDXA system. The chemicals detected include carbon, nitrogen, oxygen, fluorine, aluminum and silicon. Depending on the composition of the insulating layer, it is likely that carbon and fluorine may be the true contaminants arising from a prior photoresist pattern/etch process. The aluminum may be present in a layer or feature formed on top of the examined insulating layer. Similarly, the silicon is an element of the examined insulating layer such as, for example, silicon dioxide. It should be understood that contaminant defects may be detected on other types of layers within a semiconductor structure such as, for example, metal lines and plugs.

Referring again to FIGS. 3 and 4, chemicals contained in the contaminant defects 60 in the top critical layer may be detected using AES since AES is most effective at the surface or 1–5 nm from the top surface of the semiconductor structure 50.

FIG. 6 shows a graph of an exemplary particle analysis 80 of the contaminant defects such as the defects 60 on the critical layer 56 (FIG. 3). The particle analysis 80 has been generated by an AES system. Here, intensity signals are shown as a function of electron signal intensity versus electron energy. As can be seen, silicon (Si) and aluminum (Al) are detected which may mean that traces of aluminum have been found on a silicon-containing layer. The aluminum may or may not constitute a defect depending on the type of layer examined and/or features formed in or on the layer. Therefore, the particle analysis 80 may indicate that no defects are present on the wafer structure at this time or at this stage of fabrication.

The present invention as described above facilitates defect detection at critical layers at or below the surface of a semiconductor structure, thereby mitigating product yield loss, manufacturing costs and delays and circuit failure.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for monitoring in-situ a chemical composition at or near a surface of a wafer during plasma etch to detect defects comprising:

providing a semiconductor substrate comprising at least one top layer, wherein the semiconductor substrate comprises at least one chemical-containing contaminant;

subjecting the semiconductor substrate to a plasma etch process, whereby at least a portion of the top layer is removed;

during the plasma etch process, detecting for a presence of the chemical-containing contaminant using one of an Auger Electron Spectroscopy system or Energy Dispersive X-ray Analysis system; and if present, determining whether the presence of the chemical-containing contaminant exceeds a threshold limit.

2. The method of claim 1, wherein the at least one chemical-containing contaminant includes any one of carbon, calcium, sulfur, aluminum, tungsten and nickel.

3. The method of claim 1, wherein the semiconductor substrate is enclosed in a plasma etch chamber during the plasma etch process.

4. The method of claim 3, wherein the plasma etch chamber comprises at least one chemical-contaminant-sensitive detector systems.

5. The method of claim 1, wherein the defect detector, using one of an Auger Electron Spectroscopy system or Energy Dispersive X-ray Analysis system, indicates the presence of the one or more chemical contaminants at or below a top surface of the top layer.

6. The method of claim 5, wherein the Auger electron spectroscopy system indicates the presence of the one or more chemical contaminants at a top Surface of the top layer and at about a 1–5 nm depth from the top layer surface.

7. The method of claim 5, wherein the Energy Dispersive X-ray Analysis system indicates the presence of the one or more chemical contaminants at about 1–2 Fm from the top layer surface.

8. The method of claim 1, further comprising suspending a semiconductor fabrication process if the chemical-containing contaminant exceeds the threshold limit.

9. A method for monitoring in-situ a chemical composition at or near a top surface of a wafer during plasma etch to detect defects comprising:

providing a semiconductor substrate comprising at least one top layer, wherein the semiconductor substrate comprises at least one chemical-containing contaminant;

subjecting the semiconductor substrate to a plasma etch process, whereby at least a portion of the top layer is removed;

during the plasma etch process, detecting for a presence of the chemical-containing contaminant using one of an Auger Electron Spectroscopy system or Energy Dispersive X-ray Analysis system; and if present, suspending the semiconductor fabrication process when the at least one chemical-containing contaminant exceeds a threshold limit.

10. The method of claim 9, wherein the at least one chemical-containing contaminant includes any one of carbon, calcium, sulfur, aluminum, tungsten and nickel.

11. The method of claim 9, wherein the Auger Electron Spectroscopy system indicates the presence of the one or more chemical contaminants at the surface of the top layer or at about a 1–5 nm depth from the top layer surface.

12. The method of claim 9, wherein the Energy Dispersive X-ray Analysis system indicates the presence of the one or more chemical contaminants at about a 1–2 Fm depth from the top layer surface.

13. A method for monitoring in-situ a chemical composition at or near a surface of a wafer during plasma etch to detect defects comprising:

providing a semiconductor substrate comprising at least one top layer, wherein the semiconductor substrate comprises at least one chemical-containing contaminant;

subjecting the semiconductor substrate to a plasma etch process, whereby at least a portion of the top layer is removed;

during the plasma etch process, detecting for a presence of the chemical-containing contaminant and determining an amount of the chemical-containing contaminant using one of an Auger Electron Spectroscopy system or Energy Dispersive X-ray Analysis system; and if present, determining whether the presence of the chemical-containing contaminant exceeds a threshold limit.

14. The method of claim 13, wherein the at least one chemical-containing contaminant includes any one of carbon, calcium, sulfur, aluminum, tungsten and nickel.

15. The method of claim 13, wherein the semiconductor substrate is enclosed in a plasma etch chamber during the plasma etch process.

16. The method of claim 15, wherein the plasma etch chamber comprises at least one chemical-contaminant-sensitive detector systems.

17. The method of claim 13, wherein the defect detector, using one of an Auger Electron Spectroscopy system or Energy Dispersive X-ray Analysis system, indicates the presence of the one or more chemical contaminants at or below a top surface of the top layer.

18. The method of claim 17, wherein the Auger electron spectroscopy system indicates the presence of the one or more chemical contaminants at a top surface of the top layer and at about a 1–5 nm depth from the top layer surface.

19. The method of claim 17, wherein the Energy Dispersive X-ray Analysis system indicates the presence of the one or more chemical contaminants at about 1–2 Fm from the top layer surface.

20. The method of claim 13, further comprising suspending a semiconductor fabrication process if the chemical-containing contaminant exceeds the threshold limit.

* * * * *